United States Patent
Qi et al.

(10) Patent No.: US 11,205,752 B2
(45) Date of Patent: Dec. 21, 2021

(54) MASK FRAME AND METHOD FOR MANUFACTURING THE SAME, MASK ASSEMBLY FOR EVAPORATION AND EVAPORATION APPARATUS

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Haiping Qi, Beijing (CN); Chunchieh Huang, Beijing (CN); Zhen Wang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/768,582

(22) PCT Filed: Oct. 11, 2018

(86) PCT No.: PCT/CN2018/109785
§ 371 (c)(1),
(2) Date: May 29, 2020

(87) PCT Pub. No.: WO2019/184297
PCT Pub. Date: Oct. 3, 2019

(65) Prior Publication Data
US 2021/0175424 A1    Jun. 10, 2021

(30) Foreign Application Priority Data
Mar. 28, 2018  (CN) .......................... 201810266417.0

(51) Int. Cl.
*C23C 14/04* (2006.01)
*H01L 51/00* (2006.01)
(Continued)

(52) U.S. Cl.
CPC ........ *H01L 51/0011* (2013.01); *C23C 14/042* (2013.01); *C23C 14/24* (2013.01); *H01L 51/001* (2013.01); *H01L 51/56* (2013.01)

(58) Field of Classification Search
CPC .......................... C23C 14/042; H01L 51/0011
See application file for complete search history.

(56) References Cited

U.S. PATENT DOCUMENTS

2007/0184195 A1* 8/2007 Hatakeyama ......... C23C 14/042
427/282
2011/0048323 A1* 3/2011 Kondo .................. C23C 14/042
118/500
(Continued)

FOREIGN PATENT DOCUMENTS

CN         105839051 A        8/2016
CN         106048520 A       10/2016
(Continued)

OTHER PUBLICATIONS

First Office Action for Chinese Application No. 201810266417.0, dated April 3, 2019, 8 Pages.
International Search Report and Written Opinion for Application No. PCT/CN2018/109785, dated Jan. 11, 2019, 11 Pages.

*Primary Examiner* — Keath T Chen
(74) *Attorney, Agent, or Firm* — Brooks Kushman P.C.

(57) ABSTRACT

A mask frame and a method for manufacturing the same, a mask assembly for evaporation and an evaporation apparatus are provided. The mask frame includes a frame body. The frame body includes a plurality of frame members, and the frame body comprises a first surface and a second surface opposite to each other. A plurality of grooves are provided
(Continued)

at intervals on the first surface of each of the plurality of frame members and along an extending direction of the frame member, and each groove is formed by the first surface recessing towards the second surface, and has a groove depth in a direction perpendicular to the first surface. For the plurality of grooves in each frame member, a groove depth of the groove at a middle position of the frame member is smaller than the grooves at two ends of the frame member.

19 Claims, 2 Drawing Sheets

(51) Int. Cl.
*C23C 14/24* (2006.01)
*H01L 51/56* (2006.01)

(56) References Cited

U.S. PATENT DOCUMENTS

| | | |
|---|---|---|
| 2015/0299840 A1 | 10/2015 | Osaki et al. |
| 2016/0260935 A1 | 9/2016 | Lee |
| 2018/0209028 A1 | 7/2018 | Li et al. |
| 2018/0248120 A1 | 8/2018 | Zhang et al. |

FOREIGN PATENT DOCUMENTS

| | | |
|---|---|---|
| CN | 106086781 A | 11/2016 |
| CN | 106480404 A | 3/2017 |
| CN | 206266700 U | 6/2017 |
| CN | 107099769 A | 8/2017 |
| CN | 108468018 A | 8/2018 |
| JP | 2006249544 A | 9/2006 |

* cited by examiner

MASK FRAME AND METHOD FOR MANUFACTURING THE SAME, MASK ASSEMBLY FOR EVAPORATION AND EVAPORATION APPARATUS

CROSS-REFERENCE TO RELATED APPLICATIONS

This application is the U.S. national phase of PCT Application No. PCT/CN2018/109785 filed on Oct. 11, 2018, which claims priority to Chinese Patent Application No. 201810266417.0 filed on Mar. 28, 2018, which are incorporated herein by reference in their entireties.

TECHNICAL FIELD

The present disclosure relates to the field of display technology, and in particular to a mask frame and a method for manufacturing the same, a mask assembly for evaporation and an evaporation apparatus.

BACKGROUND

Organic light-emitting diode (OLED) display technologies gradually replace liquid crystal display (LCD) due to its advantages in various aspects. The development of OLED display technology has ushered in a golden age, and manufacturers continuously launch various disruptive products to attract people's attention.

In OLED manufacturing technologies, a mask for vacuum evaporation is a vital component, and the quality of the mask directly affects the manufacturing cost and product quality. Masks used in the OLED evaporation process mainly include a fine metal mask (FMM). The FMM is used to vaporize materials of a light-emitting layer to form pixel patterns on an evaporation substrate, and an auxiliary supporting mask is provided below the FMM. The auxiliary supporting mask mainly includes supporting bars (howling sheets) and covering bars (cover sheets) arranged in a crisscross pattern to support the FMM and to define the shape of display areas on the evaporation substrate, and four sides of FMM and the supporting mask are welded onto the mask frame.

Due to tensile forces of the supporting bars and the covering bars on the mask frame below the supporting bars and the covering bars, the mask frame may be deformed, which results in different sinking amounts of the supporting bars, the covering bars and the FMM on the mask frame. Each of the supporting bar, the covering bar and the FMM is in a decurved state as the whole, where two sides thereof are higher than the middle portion. With the increase in the number of pixels (PPI), due to the downward bending of the mask, it may cause problems of alignment shift between the mask and the evaporation substrate or an increased shadow, which may greatly cause product defects such as mixing display colors, and may further affect the yield of the entire batch of products.

SUMMARY

The technical solutions provided by the present disclosure are as follows.

In a first aspect, embodiments of the present disclosure provide a mask frame including a frame body. The frame body includes a plurality of frame members, and the frame body includes a first surface and a second surface opposite to each other; a plurality of grooves are provided at intervals on the first surface of each of the plurality of frame members and along an extending direction of the frame member, and each of the plurality of grooves is formed by the first surface recessing towards the second surface, and has a groove depth in a direction perpendicular to the first surface; and for the plurality of grooves in each of the plurality of frame members, the groove depth of the groove at a middle position of the frame member is smaller than the groove depths of the grooves at two ends of the frame member.

Optionally, the groove depths of the plurality of grooves on each frame member are gradually increased from the middle position of the frame member to the two ends of the frame member.

Optionally, among the plurality of grooves on each frame member, a distance between any two adjacent grooves in the extending direction of the frame member is equal to a distance between any other two adjacent grooves in the extending direction of the frame member, and a difference between the groove depths of each two adjacent grooves is a predetermined value.

Optionally, among the plurality of grooves in each frame member, a difference between the groove depths of each two adjacent grooves ranges from 1 microns to 10 microns.

Optionally, the plurality of grooves in each frame member is symmetrically distributed on the frame member with respect to an axis of symmetry, and the axis of symmetry passes through a center point between two ends of the frame member, and is perpendicular to the first surface.

Optionally, among a pair of oppositely arranged frame members, a plurality of grooves in one of the frame members is provided in a one-to-one correspondence with a plurality of grooves in the other frame member, and the groove depth of each groove in one of the frame members is the same as the groove depth of another groove in the other frame member and corresponding to the each groove.

Optionally, a difference between the groove depths of any two grooves is smaller than or equal to 100 microns.

In a second aspect, embodiments of the present disclosure provide a mask assembly for evaporation, which includes: a first mask, where the first mask includes a plurality of supporting bars and a plurality of covering bars arranged in a crisscross manner; a second mask stacked on the first mask, the second mask being a fine metal mask (FMM); and the mask frame as described above. Two ends of each of the plurality of supporting bars are respectively welded into grooves of a pair of oppositely arranged frame members in the plurality of frame members of the mask frame. Two ends of each of the plurality of covering bars are respectively welded into grooves of another pair of oppositely arranged frame members in the plurality of frame members of the mask frame. Peripheral edges of the second mask are welded onto the first surface of the mask frame.

Optionally, groove bottoms of grooves on each pair of oppositely arranged frame members in the mask frame are in a same plane, so that the plurality of the covering bars are in a same plane, and the plurality of supporting bars are in a same plane.

In a third aspect, embodiments of the present disclosure provide an evaporation apparatus, which includes the mask assembly for evaporation as described above.

In a fourth aspect, embodiments of the present disclosure provide a method for manufacturing a mask frame, which is used to manufacture the mask frame as described above. The method includes:

obtaining a groove depth compensation value $\Delta h$ for each of the plurality of grooves, where the groove depth compensation value $\Delta h$ is used to compensate a sinking amount h of the mask at a position corresponding to each groove, to make the plurality of the covering bars in a same plane, and to make the plurality of supporting bars in a same plane;

determining a groove depth value H of each groove according to the groove depth compensation value Δh; and setting the plurality of grooves in the provided frame body according to the groove depth value H.

Optionally, the obtaining the groove depth compensation value Δh for each of the plurality of grooves includes:

providing a sample of an evaporation mask, where the sample of the evaporation mask includes an initial mask frame, an initial auxiliary mask and an initial fine mask (FMM), and the initial auxiliary mask includes a plurality of initial supporting bars and a plurality of initial covering bars arranged in a crisscross manner;

detecting the sinking amount h of each of the plurality of initial supporting bars and the plurality of initial covering bars in the sample of the evaporation mask;

obtaining, according to the sinking amount h, the groove depth compensation value Δh corresponding to each of the plurality of initial supporting bars and each of plurality of the initial covering bars; and obtaining the groove depth value H of each groove according to the groove depth compensation value Δh.

Optionally, the detecting the sinking amount h of each of the plurality of initial supporting bars and the plurality of initial covering bars in the sample of the evaporation mask includes:

detecting the sinking amount h by using a laser detector, where the laser detector includes a laser emitting element configured to emit a horizontal laser beam and a laser receiving element configured to generate an sensing signal when receiving the laser beam, and the sample of the evaporation mask is placed horizontally;

emitting the horizontal laser beam from one end to another end of each initial supporting bar, moving the laser detector in a vertical direction, obtaining a current height value of the each initial supporting bar according to a change of the sensing signal of the laser receiving element, and obtaining the sinking amount of the each initial supporting bar by comparing the current height value of the each initial supporting bar with a predetermined height value; and emitting the horizontal laser beam from one end to another end of each initial covering bar, moving the laser detector in a vertical direction, obtaining a current height value of the each initial covering bar according to a change of the sensing signal of the laser receiving element, and obtaining the sinking amount of the each initial covering bar by comparing the current height value of the each initial covering bar with a predetermined height value.

BRIEF DESCRIPTION OF THE DRAWINGS

In order to more clearly illustrate technical solutions according to embodiments of the present disclosure, the accompanying drawings, which are intended to be used in the description of the embodiments, will be briefly described below. It is apparent that the accompanying drawings described in the following description are merely some embodiments of the present disclosure. Those skilled in the art can obtain other accompanying drawings according to these accompanying drawings without creative efforts.

DETAILED DESCRIPTION

Figure 1:
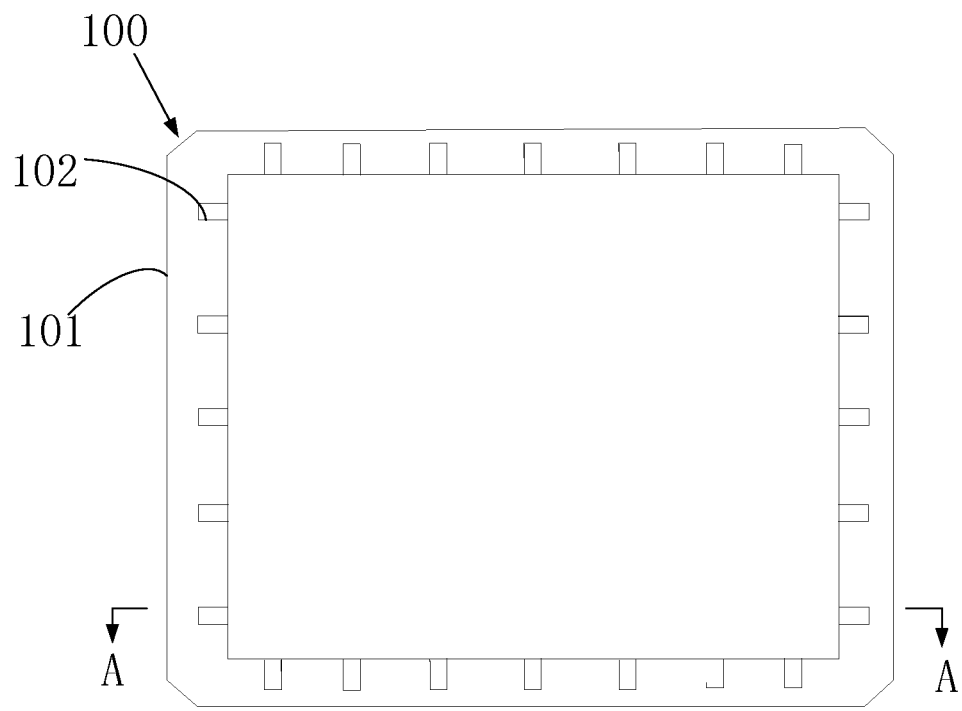
FIG. 1 shows a front view of a mask frame according to an embodiment of the present disclosure.

Technical solutions in embodiments of the present disclosure will be described clearly and completely in conjunction with the accompanying drawings according to the embodiments of the present disclosure. Obviously, the described embodiments are part of the embodiments of the present disclosure, but not all of the embodiments. Based on the embodiments in the present disclosure, all other embodiments obtained by a person of ordinary skill in the art without creative efforts shall fall within the protection scope of the present disclosure.

For a mask assembly for vapor deposition in the related art, due to tensile forces of supporting bars and covering bars onto the mask frame below the supporting bars and the covering bars, the mask frame may be deformed, which causes the supporting bar, the covering bar and the FMM to be in a decurved state in the whole, where two sides thereof is higher than the middle portion. Problems of alignment shift between the mask and the evaporation substrate or an increased shadow may be caused, which may greatly cause product defects such as mixing display colors, and may further affect the yield of the entire batch of products.

In view of the above problems, a mask frame and a method for manufacturing the same, a mask assembly for evaporation and an evaporation apparatus are provided according to embodiments of the present disclosure, which can improve the unevenness of the mask due to deformation of the mask frame, and improve defects such as color mixing and poor uniformity, thereby improving the product yield.

It should be noted that the mask frame provided in the embodiments of the present disclosure may be applied to a mask assembly for evaporation, and may also be applied to other types of mask assembly.

An example that the mask frame is applied to the mask assembly for evaporation is given below.

In addition, before describing the mask frame and the method for manufacturing the same, the mask assembly for evaporation and the evaporation apparatus provided by the embodiments of the present disclosure, it is necessary to detail the reasons for the above problems caused by the evaporation mask in the related art.

In the related art, before supporting bars and covering bars are welded, groove depths of multiple grooves provided in all frame members of the mask frame are approximately the same. When manufacturing the mask, an auxiliary mask is welded first (including supporting bars and covering bars), and then a fine mask (FMM) is welded to obtain the mask assembly for evaporation. After the supporting bars, the covering bars and the FMM are welded to the mask frame, the supporting bars, the covering bars and the FMM may generate internal stress onto the mask frame, resulting in the deformation of the mask frame. The supporting bars, the covering bars and the FMM welded onto the mask frame have different degrees of sinking. The sinking amounts of multiple supporting bars and multiple covering bars are detected, the supporting bar or the covering bar welded to the middle area of each frame member in the mask frame has the largest sinking amount, the supporting bars or the covering bars welded to two ends of each frame member in the mask frame have the smallest sinking amount (for example, the difference between the maximum sinking amount and the minimum sinking amount may be about 50 microns). That is to say, each of the supporting bar and the covering bar as a whole is in a downward bending state with a smaller height in the middle and a larger height in both ends. Moreover, due to the sinking state of the supporting bars and the covering bars, the sinking amounts of the FMM welded onto the mask frame at different positions may also be different (for example, the difference between the maximum sinking amount and the minimum sinking amount of the FMM at different positions may reach about 100 microns).

Figure 2:
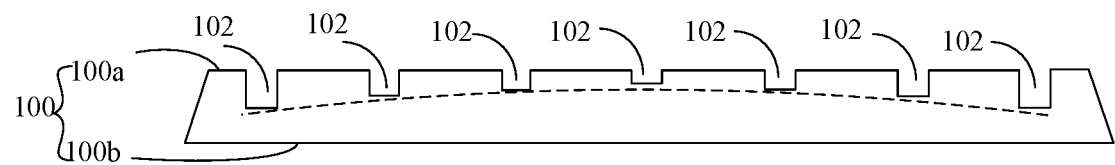
FIG. 2 shows a cross-sectional view of the mask frame taken along line A-A in FIG. 1 and before supporting bars and covering bars are welded according to an embodiment of the present disclosure.

In view of the above, as shown in FIG. 1 and FIG. 2, a mask frame provided according to an embodiment of the present disclosure includes a frame body 100. The frame body 100 includes a plurality of frame members 101, and the frame body 100 includes a first surface 100a and a second surface 100b arranged opposite to each other. A plurality of grooves 102 is arranged at intervals on the first surface 100a of each frame member 101 and along an extending direction of the frame member 101, and each groove 102 is formed by the first surface 100a recessing towards the second surface 100b, and has a groove depth in a direction perpendicular to the first surface 100a. For the plurality of grooves on each frame member 101, a groove depth of the groove 102 at a middle position of the frame member 101 is smaller than the grooves 102 at two ends of the frame member 101.

With the above solutions, since the supporting bar or the covering bar has different amounts of sinking at different positions after the mask frame is deformed, if it is expected that the supporting bars and the covering bars at different positions are still approximately at a same horizontal plane after the mask frame is deformed, the differences in the sinking amounts of the supporting bars or the covering bars at different positions may be compensated. In the above solutions, by designing different groove depths of the grooves 102 at different positions on the mask frame, the differences in the sinking amounts of the supporting bars or the covering bars at different positions are compensated.

Figure 3:
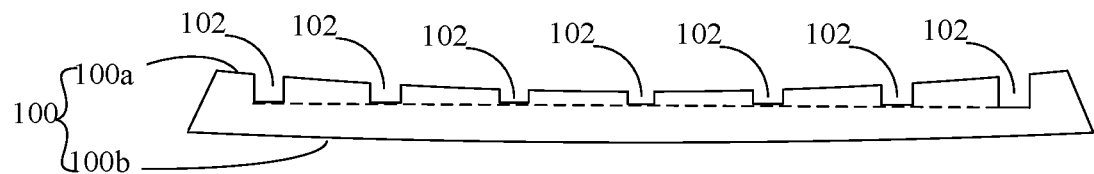
FIG. 3 shows a cross-sectional view of the mask frame taken along line A-A in FIG. 1 and after supporting bars and covering bars are welded according to an embodiment of the present disclosure.

Since the sinking amount of the supporting bar and the sinking amount of the covering bar at the middle position of the frame member 101 are larger, and the sinking amount of the supporting bar and the sinking amount of the covering bar at both ends of the frame member 101 are smaller, the mask frame is designed such that the groove 102 at the middle position of each frame member 101 has a smaller groove depth, while the grooves 102 at the two ends of each frame member 101 have a larger groove depth. In such a manner, before the supporting bars and the covering bars are welded, a connected line of groove bottoms of all the grooves 102 on each frame member 101 is generally curved upwards (as shown in FIG. 2, the dotted line in FIG. 2 indicates the connected line of the groove bottoms of every grooves 102, and at this time, the first surface 100a and the second surface 100b may be approximately a horizontal plane). After the supporting bars and the covering bars are welded onto the mask frame, when the mask frame is deformed, the groove bottoms of the grooves 102 at different positions on each frame member 101 will be approximately in a same plane (as shown in FIG. 3, the dotted line in FIG. 3 indicates the connected line of the groove bottoms of various grooves 102, at this time, the first surface 100a and the second surface 100b are substantially in a downwardly curved state, and the curvature of the second surface 100b may be the same as or slightly smaller than the curvature of the first surface 100a). Thus, the differences in the sinking amounts of the supporting bars or the covering bars at different positions are effectively compensated, so that the supporting bars and the covering bars at different positions are approximately in the same plane. The overall sinking state of the mask assembly for evaporation can be effectively improved to ensure the bonding degree of a mask and a to-be-evaporated substrate during the evaporation process, and the color mixing and poor uniformity caused by the unevenness of the mask can be improved, thereby improving the product yield.

It should be noted that specific groove depths of grooves 102 at different positions on the frame body 100 and a specific difference of groove depths between two adjacent grooves 102 may be determined according to actual conditions and target requirements.

Exemplarily, as shown in FIG. 2, the groove depths of the plurality of grooves 102 on each frame member 101 are gradually increased from the central position of the frame member 101 to both ends of the frame member 101.

With the above schemes, when the mask frame is deformed, the deformation of the middle area of the mask frame is large, the deformation of the end area of the mask frame is small, and the whole mask frame is in a decurved state as the whole with a lower position in the middle and a higher position in two sides. Accordingly, the sinking amounts of the supporting bars or the sinking amounts of the covering bars on the mask frame are gradually decreased from the central position of the frame member 101 to both ends of the frame member 101. Therefore, in order to compensate for the differences among the sinking amounts of the supporting bars or among the sinking amounts of the covering bars, the groove depths of the grooves 102 in each frame member 101 gradually increase from the central position of the frame member 101 to both ends of the frame member 101.

Of course, it can be understood that in actual applications, structures and manufacturing processes of supporting bars or covering bars for different types of mask assemblies for evaporation may be different. Therefore, the supporting bar or the covering bar has different sinking states at different positions, and groove depths of grooves 102 on each frame member 101 should be designed according to the actual situation and target requirements.

Specifically, for a certain type of evaporated mask assembly, a sample of an evaporation mask of the current manufacturing process may be provided first. The sample of the evaporation mask includes an initial mask frame, an initial auxiliary mask and an initial fine mask (FMM). The initial auxiliary mask includes a plurality of initial supporting bars and a plurality of initial covering bars arranged in a crisscross manner. A groove depth compensation amount $\Delta h$ at a position corresponding to each initial supporting bar and each initial covering bar is designed based on a detected sinking amount h of the each initial supporting bar and the each initial covering bar, and a groove depth H of each groove 102 on the mask frame is designed based on the groove depth compensation amount $\Delta h$.

As an example, it is assumed that in a sample of the evaporation mask, a first groove has a sinking amount of $h1$ after the supporting bar has been welded, and a second groove adjacent to the first groove has a sinking amount of h2 after the supporting bar has been welded, the groove depth H1 of the first groove on the mask frame designed according to the sample of the evaporation mask should be smaller than the groove depth H2 of the second groove, and H2−H1=h1−h2.

In addition, as an example, as shown in FIG. 1 and FIG. 2, in the plurality of grooves 102 on each frame member 101, distances between any two adjacent grooves in the extending direction of the frame member 101 are equal, and a difference between groove depths of each two adjacent grooves is a predetermined value.

Based on the above solutions, in an exemplary embodiment, the grooves 102 on the mask frame are designed such that distances between any two adjacent grooves are equal, and a difference between groove depths of each two adjacent grooves is a predetermined value. As an example, if a groove depth of the groove in the middle of the frame member is equal to a thickness of the welded supporting bar or covering bar, depths of grooves located on both sides of the groove are progressively increased by a step of the predetermined value.

Of course, it can be understood that the above embodiment is only as an example. In practical applications, differences among the groove depths of various grooves 102 on the mask frame may also be different, and should be designed based on the sinking amounts of various supporting bars and various covering bars detected through a sample of the evaporation mask.

In addition, exemplarily, in the plurality of grooves 102 on each of the frame members 101, the difference between the groove depths of any two adjacent grooves ranges from 1 microns to 10 microns, and the difference between groove depths of any two grooves is less than or equal to 100 microns.

Based on the above solutions, because the difference between sinking amounts of any two adjacent grooves on the mask frame is generally between 1 microns and 10 microns, the difference between the maximum sinking amount and the minimum sinking amount of each supporting bar or covering bar on the same frame member 101 may not exceed 100 microns. Therefore, in designing, the difference between the groove depths of two adjacent grooves is preferably between 1 and 10 microns, and the difference between groove depths of a groove with the largest groove depth and a groove with the smallest groove depth is smaller than or equal to 100 microns. Of course, it may be understandable that the difference between the groove depths of two grooves is not limited to these.

Exemplarily, as shown in FIG. 1 and FIG. 2, the plurality of grooves on each frame member 101 is symmetrically distributed on the frame member about a symmetry axis, and the symmetry axis passes through a center point between two ends of the frame member, and is perpendicular to the first surface 100a.

Based on the above solutions, in an exemplary embodiment, the plurality of grooves 102 on each frame member 101 is symmetrically distributed, which can facilitate structural design and process manufacturing. Of course, it can be understood that the forgoing is only as an example, and in practical applications, positions of the grooves 102 distributed on the mask frame are not limited thereto.

In addition, for example, in a pair of frame members that are oppositely arranged, a plurality of grooves on one of the frame members is provided in a one-to-one correspondence with a plurality of grooves on the other frame member, and a groove depth of each groove on one of the frame members is the same as a groove depth of another groove on the other frame member and corresponding to the each groove.

Based on the above solutions, since two ends of the supporting bar or the covering bar are respectively arranged on a pair of oppositely arranged frame members, grooves in one frame member of the pair of oppositely arranged frame members may be arranged in one-to-one correspondence with grooves in the other frame member of the pair of oppositely arranged frame members, and two corresponding grooves have the same groove depth, thereby enabling each supporting bar or each covering bar to be on the same horizontal plane.

Figure 4:
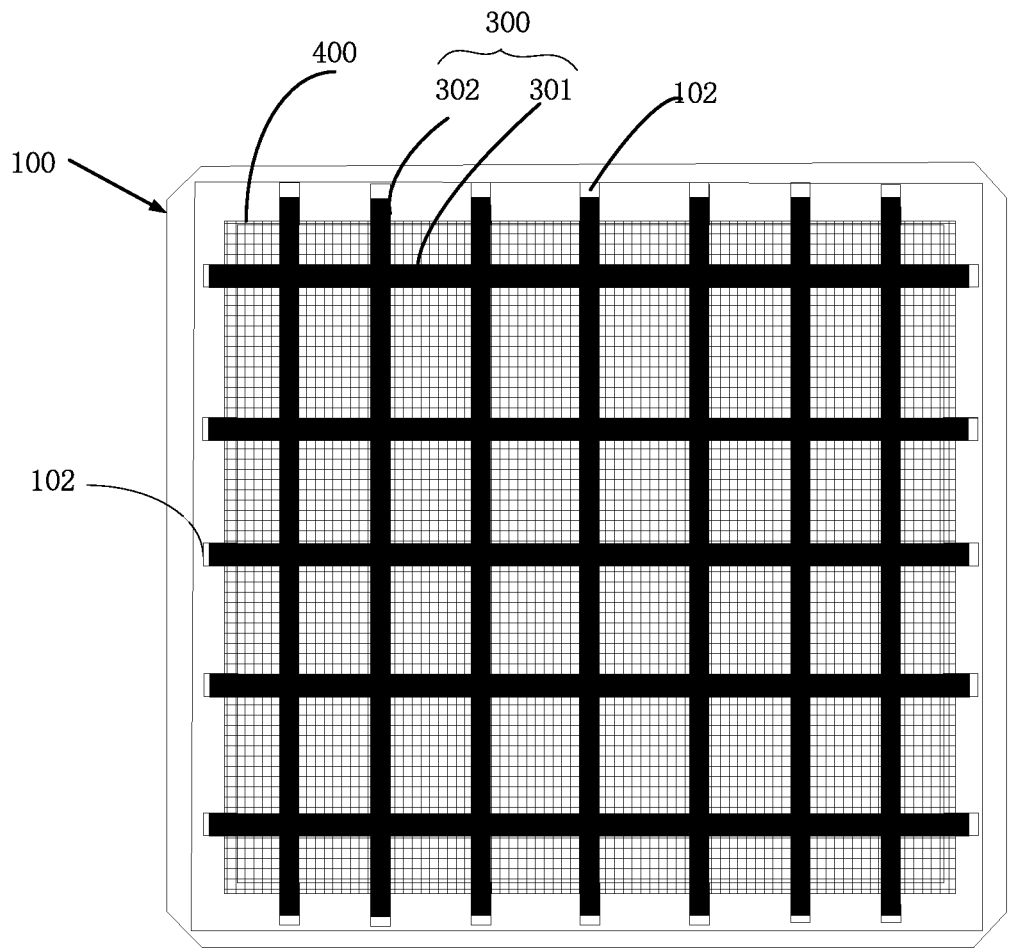
FIG. 4 shows a schematic structural view of a mask assembly for evaporation according to an embodiment of the present disclosure.

In addition, as shown in FIG. 4, an embodiment of the present disclosure further provides a mask assembly for evaporation, including:

a first mask 300, where the first mask 300 includes a plurality of supporting bars 301 and a plurality of covering bars 302 arranged in a crisscross manner;

a second mask 400 stacked on the first mask 300, the second mask 400 being a fine metal mask (FMM); and the mask frame provided in the embodiments of the present disclosure, where two ends of each supporting bar 301 are respectively welded into grooves 102 of a pair of the frame members 101 oppositely arranged in the mask frame, two ends of each covering bar 302 are respectively welded into the grooves 102 of another pair of the frame members 101 oppositely arranged in the mask frame, and peripheral edges of the second mask 400 are welded onto the first surface 100a of the mask frame.

Based on the above solutions, since the supporting bar 301 or the covering bar 302 has different amounts of sinking at different positions after the mask frame is deformed, if it is expected that the supporting bars and the covering bars at different positions are still approximately at a same horizontal plane after the mask frame is deformed, the differences in the sinking amounts of the supporting bars or the covering bars at different positions may be compensated. In the above solutions, by designing different groove depths of the grooves 102 at different positions on the mask frame, the differences in the sinking amounts of the supporting bars or the covering bars at different positions are compensated.

Since the sinking amount of the supporting bar and the sinking amount of the covering bar at the middle position of the frame member 101 are larger, and the sinking amount of the supporting bar and the sinking amount of the covering bar at both ends of the frame member 101 are smaller, the mask frame is designed such that the groove 102 at the middle position of each frame member 101 has a smaller groove depth, while the groove 102 at the two ends of each frame member 101 has a larger groove depth. In such a manner, before the supporting bars and the covering bars are welded, a connected line of groove bottoms of all the grooves 102 on each frame member 101 is generally curved upwards. After the supporting bars and the covering bars are welded onto the mask frame, when the mask frame is deformed, the groove bottoms of the grooves 102 at different positions on each frame member 101 will be approximately in a same plane. Thus, the differences in the sinking amounts of the supporting bars or the covering bars at different positions are effectively compensated, so that the supporting bars and the covering bars at different positions are approximately in the same plane. The overall sinking state of the mask assembly for evaporation can be effectively improved to ensure the bonding degree of a mask and a to-be-evaporated substrate during the evaporation process, and the color mixing and poor uniformity caused by the unevenness of the mask can be improved, thereby improving the product yield.

It should be noted that specific groove depths of grooves 102 at different positions on the frame body 100 and a specific difference of groove depths between two adjacent grooves 102 may be determined according to actual conditions and target requirements.

In the mask frame of the mask assembly for evaporation provided by the embodiments of the present disclosure, groove bottoms of grooves on a pair of frame members arranged oppositely are in the same plane, so that the plurality of the covering bars are in the same plane, and the plurality of supporting bars are in the same plane.

In the above solutions, since groove depths of various grooves 102 on the mask frame are differentiated to compensate for the difference among the sinking amounts of the supporting bars and the covering bars, in the mask assembly for evaporation provided by the embodiments of the present disclosure, before welding the supporting bars and the covering bars to the mask frame, the plurality of grooves 102 on each frame member 101 is of an upwardly curved shape as a whole (as shown in FIG. 2). After the supporting bars and the covering bars are welded onto the mask frame, the groove bottoms of grooves 102 on each frame member 101 are in the same plane (as shown in FIG. 3), so that multiple covering bars are in the same plane, and multiple supporting bars are in the same plane.

In addition, an embodiment of the present disclosure further provides an evaporation apparatus, which includes the mask assembly for evaporation provided in the embodiments of the present disclosure.

Figure 5:
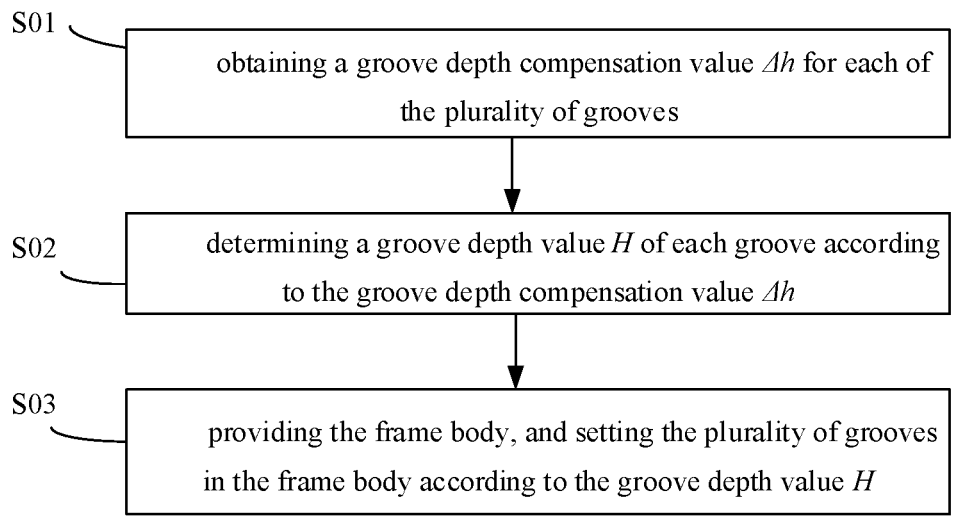
FIG. 5 shows a flowchart of a method for manufacturing a mask frame according to an embodiment of the present disclosure.

In addition, an embodiment of the present disclosure further provides a method for manufacturing a mask frame, which is used to manufacture the mask frame in the embodiments of the present disclosure. As shown in FIG. 5, the method includes:

step S01, obtaining a groove depth compensation value Δh for each of the plurality of grooves, where the groove depth compensation value Δh is used to compensate a sinking amount h of the mask at a position corresponding to each groove, to make the plurality of the covering bars in a same plane, and to make the plurality of supporting bars in a same plane;

step S02, determining a groove depth value H of each groove according to the groove depth compensation value Δh; and step S03, providing a frame body 100, and setting the plurality of grooves 102 in the frame body 100 according to the groove depth value H.

With the above solutions, since the supporting bar or the covering bar has different amounts of sinking at different positions after the mask frame is deformed, if it is expected that the supporting bars and the covering bars at different positions are still approximately at a same horizontal plane after the mask frame is deformed, the differences in the sinking amounts of the supporting bars or the covering bars at different positions may be compensated. In the above solutions, in designing grooves 102 of the mask frame, the sinking amount h of each supporting bar or each covering bar at a position corresponding to each groove 102 may be first obtained after the supporting bars and the covering bars are welded onto the mask frame, the groove depth compensation value Δh is obtained according to the sinking amount, and the groove depth of each groove 102 is designed according to the groove depth compensation value Δh. Therefore, groove depths of grooves 102 at different positions of the mask frame are differentiated to compensate for the difference among the sinking amounts of the supporting bars or the covering bars at different positions. The overall sinking state of the mask assembly for evaporation can be effectively improved to ensure the bonding degree of a mask and a to-be-evaporated substrate during the evaporation process, and the color mixing and poor uniformity caused by the unevenness of the mask can be improved, thereby improving the product yield.

Optionally, the above step S01 specifically includes:

step S011, providing a sample of an evaporation mask, where the sample of the evaporation mask includes an initial mask frame, an initial auxiliary mask and an initial fine mask (FMM), and the initial auxiliary mask includes a plurality of initial supporting bars and a plurality of initial covering bars arranged in a crisscross manner;

step S012, detecting the sinking amount h of each of the plurality of initial supporting bars and the plurality of initial covering bars in the sample of the evaporation mask;

step S013, obtaining, according to the sinking amount h, the groove depth compensation value Δh corresponding to each of the plurality of initial supporting bars and each of plurality of the initial covering bars; and step S014, obtaining the groove depth value H of each groove according to the groove depth compensation value Δh.

With the above solution, for a certain type of evaporated mask assembly, a sample of an evaporation mask of the current manufacturing process may be provided first. The sample of the evaporation mask includes an initial mask frame, an initial auxiliary mask and an initial fine mask (FMM). The initial auxiliary mask includes a plurality of initial supporting bars and a plurality of initial covering bars arranged in a crisscross manner. A groove depth compensation amount Δh at a position corresponding to each initial supporting bar and each initial covering bar is designed based on a detected sinking amount h of the each initial supporting bar and the each initial covering bar, and the groove depth H of each groove 102 in the mask frame is designed based on the groove depth compensation amount Δh.

As an example, it is assumed that in a sample of the evaporation mask, a first groove has a sinking amount of h1 after the supporting bar has been welded, and a second groove adjacent to the first groove has a sinking amount of h2 after the supporting bar has been welded, the groove depth H1 of the first groove in the mask frame designed according to the sample of the evaporation mask should be smaller than the groove depth H2 of the second groove, and H2−H1=h1−h2.

In addition, optionally, the above step S012 specifically includes:

detecting the sinking amount h by using a laser detector, wherein the laser detector comprises a laser emitting element configured to emit a horizontal laser beam and a laser receiving element configured to generate a sensing signal when receiving laser light, and the sample of the evaporation mask is placed horizontally;

emitting the horizontal laser beam from one end to another end of each initial supporting bar, moving the laser detector in a vertical direction, obtaining a current height value of the each initial supporting bar according to a change of the sensing signal of the laser receiving element, and obtaining the sinking amount of the each initial supporting bar by comparing the current height value of the each initial supporting bar with a predetermined height value; and emitting the horizontal laser beam from one end to another end of each initial covering bar, moving the laser detector in a vertical direction, obtaining a current height value of the each initial covering bar according to a change of the sensing signal of the laser receiving element, and obtaining the sinking amount of the each initial covering bar by comparing the current height value of the each initial covering bar with a predetermined height value.

Based on the above solutions, a laser detector may be used to detect the sinking amount h of each initial covering bar and each initial supporting bar on the sample of the evaporation mask, where the sample of the evaporation mask is placed horizontally. An example is given that the sinking amount of one of the supporting bars is detected, a laser emitter is provided on one end of the supporting bar, a laser receiving element is provided on the other end of the supporting bar, and a horizontal laser beam is emitted by the laser emitter from one end to the other end of the supporting bar. In a case that the horizontal laser beam emitted by the laser emitter is not blocked by the supporting bar, the laser receiving element may receive the laser and generate a signal. Therefore, the laser emitter and the laser receiving element may be placed at an initial height that is smaller than the horizontal height of the sample of the evaporation mask. At this time, the laser receiving element can receive the laser, and the laser generator and the laser receiving element are moved synchronously in the vertical direction. When the laser receiving element cannot receive the laser, it is considered that the height of the laser generator and the laser receiving element at this time is the height of the supporting bar, and by comparing it with the predetermined height value of the supporting bar, the sinking amount of the supporting bar can be obtained. Sinking amounts of other supporting bars and other covering bars are detected by repeating the above steps, so as to obtain the sinking amounts of each supporting bar and each covering bar.

It should be understood that, in practical applications, specific implementable manners of the above step S012 are not limited to this.

The above embodiments are only specific implementations of the present disclosure, but a protection scope of the present disclosure is not limited thereto. Any modifications or replacements that would easily occur to those skilled in the art, without departing from the technical scope disclosed in the disclosure, should be encompassed in the protection scope of the present disclosure. Therefore, the protection scope of the present disclosure shall be subject to the protection scope of the claims.

What is claimed is:

1. A mask frame, comprising a frame body,
wherein the frame body comprises four of frame members, and the frame body comprises a first surface and a second surface opposite to each other;
a plurality of grooves are provided at intervals on the first surface of each of the frame members and along an extending direction of the frame member, and each of the plurality of grooves is formed by the first surface recessing towards the second surface, and has a groove depth in a direction perpendicular to the first surface; and
for the plurality of grooves in each of the frame members, the groove depth of the groove at a middle position of the frame member is smaller than the groove depths of the grooves at two ends of the frame member.

2. The mask frame according to claim 1, wherein the groove depths of the plurality of grooves in each frame member are gradually increased from the middle position of the frame member to the two ends of the frame member.

3. The mask frame according to claim 2, wherein among the plurality of grooves in each frame member, a distance between any two adjacent grooves in the extending direction of the frame member is equal to a distance between any other two adjacent grooves in the extending direction of the frame member, and a difference between the groove depths of each two adjacent grooves is a predetermined value.

4. The mask frame according to claim 1, wherein among the plurality of grooves in each frame member, a difference between the groove depths of each two adjacent grooves ranges from 1 microns to 10 microns.

5. The mask frame according to claim 1, wherein the plurality of grooves in each frame member are symmetrically distributed in the frame member with respect to an axis of symmetry, and the axis of symmetry passes through a center point between two ends of the frame member, and is perpendicular to the first surface.

6. The mask frame according to claim 1, wherein among a pair of oppositely arranged frame members, a plurality of grooves in one of the frame members are provided in a one-to-one correspondence with a plurality of grooves in the other frame member, and the groove depth of each groove in one of the frame members is the same as the groove depth of another groove in the other frame member and corresponding to the each groove.

7. The mask frame according to claim 1, wherein a difference between the groove depths of any two grooves is smaller than or equal to 100 microns.

8. A mask assembly for evaporation, comprising:
a first mask, wherein the first mask comprises a plurality of supporting bars and a plurality of covering bars arranged in a crisscross manner;
a second mask stacked on the first mask, the second mask being a fine metal mask (FMM); and
a mask frame comprising a frame body,
wherein the frame body comprises four frame members, and the frame body comprises a first surface and a second surface opposite to each other; a plurality of grooves are provided at intervals on the first surface of each of the frame members and along an extending direction of the frame member, and each of the plurality of grooves is formed by the first surface recessing towards the second surface, and has a groove depth in a direction perpendicular to the first surface; and for the plurality of grooves in each of the frame members, the groove depth of the groove at a middle position of the frame member is smaller than the groove depths of the grooves at two ends of the frame member,
wherein two ends of each of the plurality of supporting bars are respectively welded into grooves of a pair of oppositely arranged frame members in the four frame members of the mask frame,
two ends of each of the plurality of covering bars are respectively welded into grooves of another pair of oppositely arranged frame members in the four frame members of the mask frame, and
peripheral edges of the second mask are welded onto the first surface of the mask frame.

9. The mask assembly for evaporation according to claim 8, wherein groove bottoms of grooves in each pair of oppositely arranged frame members in the mask frame are in a same plane, so that the plurality of the covering bars are in a same plane, and the plurality of supporting bars are in a same plane.

10. An evaporation apparatus, comprising the mask assembly for evaporation according to claim 8.

11. The mask assembly for evaporation according to claim 8, wherein the groove depths of the plurality of grooves in each frame member are gradually increased from the middle position of the frame member to the two ends of the frame member.

12. The mask assembly for evaporation according to claim 11, wherein among the plurality of grooves in each frame member, a distance between any two adjacent grooves in the extending direction of the frame member is equal to a distance between any other two adjacent grooves in the extending direction of the frame member, and a difference between the groove depths of each two adjacent grooves is a predetermined value.

13. The mask assembly for evaporation according to claim 8, wherein among the plurality of grooves in each frame member, a difference between the groove depths of each two adjacent grooves ranges from 1 microns to 10 microns.

14. The mask assembly for evaporation according to claim 8, wherein the plurality, of grooves in each frame member is symmetrically distributed in the frame member with respect to an axis of symmetry, and the axis of symmetry passes through a center point between two ends of the frame member, and is perpendicular to the first surface.

15. The mask assembly for evaporation according to claim 8, wherein among a pair of oppositely arranged frame members, a plurality of grooves in one of the frame members are provided in a one-to-one correspondence with a plurality of grooves in the other frame member, and the groove depth of each groove in one of the frame members is the same as the groove depth of another groove in the other frame member and corresponding to the each groove.

16. The mask assembly for evaporation according to claim 8, wherein a difference between the groove depths of any two grooves is smaller than or equal to 100 microns.

17. A method for manufacturing the mask frame according to claim 1, wherein the method comprises:
   obtaining a groove depth compensation value $\Delta h$ for each of the plurality of grooves, wherein the groove depth compensation value $\Delta h$ is used to compensate a sinking amount h of the mask at a position corresponding to each groove, to make a plurality of the covering bars in a same plane, and to make a plurality of supporting bars in a same plane;
   determining a groove depth value H of each groove according to the groove depth compensation value $\Delta h$; and
   providing the frame body, and setting the plurality of grooves in the frame body according to the groove depth value H.

18. The method according to claim 17, wherein the obtaining the groove depth compensation value $\Delta h$ for each of the plurality of grooves comprises:
   providing a sample of an evaporation mask, wherein the sample of the evaporation mask comprises an initial mask frame, an initial auxiliary mask and an initial fine mask (FMM), and the initial auxiliary mask comprises a plurality of initial supporting bars and a plurality of initial covering bars arranged in a crisscross manner;
   detecting the sinking amount h of each of the plurality of initial supporting bars and the plurality of initial covering bars in the sample of the evaporation mask;
   obtaining, according to the sinking amount h, the groove depth compensation value $\Delta h$ corresponding to each of the plurality of initial supporting bars and each of plurality of the initial covering bars; and
   obtaining the groove depth value H of each groove according to the groove depth compensation value $\Delta h$.

19. The method according to claim 18, wherein the detecting the sinking amount h of each of the plurality of initial supporting bars and the plurality of initial covering bars in the sample of the evaporation mask comprises:
   detecting the sinking amount h by using a laser detector, wherein the laser detector comprises a laser emitting element configured to emit a horizontal laser beam and a laser receiving element configured to generate a sensing signal when receiving the laser beam, and the sample of the evaporation mask is arranged horizontally;
   emitting the horizontal laser beam from one end to another end of each initial supporting bar, moving the laser detector in a vertical direction, obtaining a current height value of the each initial supporting bar according to a change of the sensing signal of the laser receiving element, and obtaining the sinking amount of the each initial supporting bar by comparing the current height value of the each initial supporting bar with a predetermined height value; and
   emitting the horizontal laser beam from one end to another end of each initial covering bar, moving the laser detector in a vertical direction, obtaining a current height value of the each initial covering bar according to a change of the sensing signal of the laser receiving element, and obtaining the sinking amount of the each initial covering bar by comparing the current height value of the each initial covering bar with a predetermined height value.

* * * * *